(12) United States Patent
Cagdaser et al.

(10) Patent No.: US 10,200,059 B2
(45) Date of Patent: Feb. 5, 2019

(54) DIGITAL TO ANALOG CONVERTER

(71) Applicant: Apple Inc., Cupertino, CA (US)

(72) Inventors: Baris Cagdaser, Sunnyvale, CA (US); Derek K. Shaeffer, Redwood City, CA (US); Hopil Bae, Sunnyvale, CA (US); Jesse Aaron Richmond, San Francisco, CA (US); Jie Won Ryu, Campbell, CA (US); Kingsuk Brahma, Mountain View, CA (US); Mohammad B. Vahid Far, San Jose, CA (US); Shingo Hatanaka, San Jose, CA (US); Yafei Bi, Los Altos Hills, CA (US); Yuichi Okuda, Saitama (JP)

(73) Assignee: APPLE INC., Cupertino, CA (US)

( * ) Notice: Subject to any disclaimer, the term of this patent is extended or adjusted under 35 U.S.C. 154(b) by 0 days.

(21) Appl. No.: 15/697,233

(22) Filed: Sep. 6, 2017

(65) Prior Publication Data
US 2018/0083648 A1 Mar. 22, 2018

Related U.S. Application Data

(60) Provisional application No. 62/398,402, filed on Sep. 22, 2016.

(51) Int. Cl.
*H03M 1/78* (2006.01)
*H03M 1/76* (2006.01)
*H03M 1/74* (2006.01)
*H03M 1/68* (2006.01)

(52) U.S. Cl.
CPC ........... *H03M 1/785* (2013.01); *H03M 1/682* (2013.01); *H03M 1/747* (2013.01); *H03M 1/765* (2013.01); *G09G 2320/0276* (2013.01)

(58) Field of Classification Search
CPC .................. H03M 1/785; H03M 1/747; G09G 2320/0276
USPC ................................... 341/154, 144; 345/690
See application file for complete search history.

(56) References Cited

U.S. PATENT DOCUMENTS

| | | | | |
|---|---|---|---|---|
| 4,357,600 A | * | 11/1982 | Ressmeyer | H03M 1/52 341/129 |
| 4,488,144 A | * | 12/1984 | Wollman | H03M 1/74 330/9 |
| 6,617,989 B2 | | 9/2003 | Deak | |
| 6,781,536 B1 | | 8/2004 | Martins | |
| 6,937,178 B1 | | 8/2005 | Rempfer et al. | |
| 7,969,342 B2 | | 6/2011 | Tsuchi | |
| 2008/0100646 A1 | * | 5/2008 | Suzuki | G09G 3/3688 345/690 |

(Continued)

*Primary Examiner* — Joseph Lauture
(74) *Attorney, Agent, or Firm* — Fletcher Yoder PC

(57) ABSTRACT

A device includes a resistor string that includes a plurality resistors with voltage taps disposed therebetween. The device may select one particular voltage tap of the plurality of voltage taps based on received gray level data for a pixel of a display. The device also includes a first amplifier that may be coupled to a first terminal end of the resistor string. The device additionally includes a second amplifier that may be coupled to a second terminal end of the resistor string, wherein the plurality of voltage taps may each supply a tap voltage derived from a voltage between the first amplifier and the second amplifier, wherein any tap amplifier of the device coupled to a voltage tap of the plurality of voltage taps provides a reference voltage thereto.

20 Claims, 11 Drawing Sheets

(56) References Cited

U.S. PATENT DOCUMENTS

2009/0273500 A1\* 11/2009 Krymski .............. H03M 1/144
                                                                             341/155
2012/0320096 A1    12/2012 Small \* cited by examiner

DIGITAL TO ANALOG CONVERTER

CROSS-REFERENCE TO RELATED APPLICATIONS

This application claims the benefit of Provisional Application Ser. No. 62/398,402, filed on Sep. 22, 2016 and entitled "Digital to Analog Converter," which is incorporated by reference in its entirety.

BACKGROUND

This disclosure relates to electronic displays and, more particularly, to techniques to implement digital to analog converters in an electronic display.

This section is intended to introduce the reader to various aspects of art that may be related to various aspects of the present techniques, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Many electronic devices include an electronic display that displays visual representations based on received image data. More specifically, the image data may include a voltage that indicates desired luminance (e.g., brightness) of a display pixel. For example, in an organic light emitting diode (OLED) display, the image data (e.g., pixel voltage data) may be input to and amplified by one or more amplifiers of a source driver circuit. The amplified pixel voltage may then be supplied to the gate of a switching device (e.g., a thin film transistor) in a display pixel. Based on magnitude of the supplied voltage, the switching device may control magnitude of supply current flowing into a light-emitting component (e.g., OLED) of the display pixel.

Display refresh rates continue to increase to allow for improved device performance. Likewise, display bit depths (e.g., the number of bits used to indicate the color of a single pixel) also has been increasing. At the same time, ever increasing demands on electronic devices have increased the relative importance of power consumption of electronic components in a device. Given these trends, designs of existing display circuitry may be revisited.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

The present disclosure generally relates to electronic displays that display image frames to facilitate visually presenting information. Generally an electronic display displays an image frame by controlling luminance of its display pixels based at least in part on image data indicating desired luminance of the display pixels. For example, to facilitate displaying an image frame, an organic light emitting diode (OLED) may display may receive image data, amplify the image data using one or more amplifiers, and supply amplified image data to display pixels. When activated, display pixels may apply the amplified image data to the gate of a switching device (e.g., thin-film transistor) to control magnitude of the supply current flowing through a light-emitting component (e.g., OLED). In this manner, since the luminance of OLED display pixels is based on supply current flowing through their light emitting components, the image frame may be displayed based at least in part on corresponding image data.

With this in mind, and to address some of the issues mentioned above, the present techniques provide a system for operating an electronic display to increase, for example, the bit depth of image data and/or the refresh rates used by the electronic display without a corresponding increase in power consumption. Generally, an electronic display may include an analog to digital converter that outputs an analog voltage signal that corresponds to image data to be depicted on a respective pixel of the electronic display. The analog voltage signal provided by the analog to digital converter is then supplied to a source driver (e.g., amplifier) that amplifies the analog voltage signal, such that the amplified analog voltage signal is provided to the respective pixel via a data line and pixel circuitry (e.g., switching device).

So that the correct image is displayed, greater control over the voltage signal being transmitted from the analog to digital converter may be desirable. Likewise, greater speed in arriving at the voltage signal being transmitted from the analog to digital converter may be desirable. However, it is also desirable for this increased control and/or speed to be accomplished with reduced impact on power consumption. The present disclosure includes analog to digital converter circuitry that allows for increased control and/or speed of voltage generation in an analog to digital converter without an accompanying increase in power consumption and may, in fact, facilitate reducing power consumption. Additionally, techniques to alleviate potential routing issues relating to the analog to digital converter are also presented. Furthermore, circuits and techniques for correction of analog to digital converter voltage generation are set forth herein. Taken singularly, as well as together, the disclosed techniques and systems allow for a low power analog to digital converter that may be used in conjunction with electronic displays utilizing increased refresh rates and/or higher bit depths.

Various refinements of the features noted above may exist in relation to various aspects of the present disclosure. Further features may also be incorporated in these various aspects as well. These refinements and additional features may exist individually or in any combination. For instance, various features discussed below in relation to one or more of the illustrated embodiments may be incorporated into any of the above-described aspects of the present disclosure alone or in any combination. The brief summary presented above is intended only to familiarize the reader with certain aspects and contexts of embodiments of the present disclosure without limitation to the claimed subject matter.

BRIEF DESCRIPTION OF THE DRAWINGS

Various aspects of this disclosure may be better understood upon reading the following detailed description and upon reference to the drawings in which.

DETAILED DESCRIPTION

One or more specific embodiments of the present disclosure will be described below. These described embodiments are only examples of the presently disclosed techniques. Additionally, in an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but may nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding additional embodiments that also incorporate the recited features.

Present embodiments relate to improved analog to digital converter circuitry. More specifically, the current embodiments describe techniques and circuits, which may facilitate analog to digital converter circuitry to be utilized with electronic displays having increased refresh rates and/or higher bit depths. In some embodiments, the techniques may facilitate reducing power consumption of the analog to digital converter circuitry.

Figure 1:
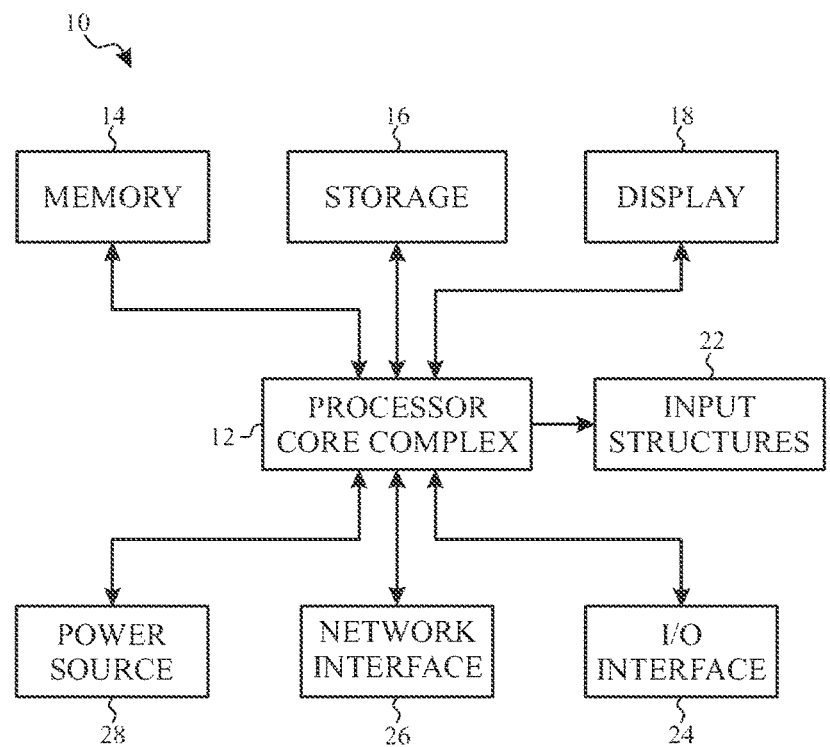
FIG. 1 is a schematic block diagram of an electronic device including a display, in accordance with an embodiment.

Turning first to FIG. 1, an electronic device 10 according to an embodiment of the present disclosure may include, among other things, a processor core complex 12 having one or more processor(s), memory 14, nonvolatile storage 16, a display 18, input structures 22, an input/output (I/O) interface 24, network interfaces 26, and a power source 28. The various functional blocks shown in FIG. 1 may include hardware elements (including circuitry), software elements (including computer code stored on a computer-readable medium) or a combination of both hardware and software elements. It should be noted that FIG. 1 is merely one example of a particular implementation and is intended to illustrate the types of components that may be present in electronic device 10.

Figure 2:
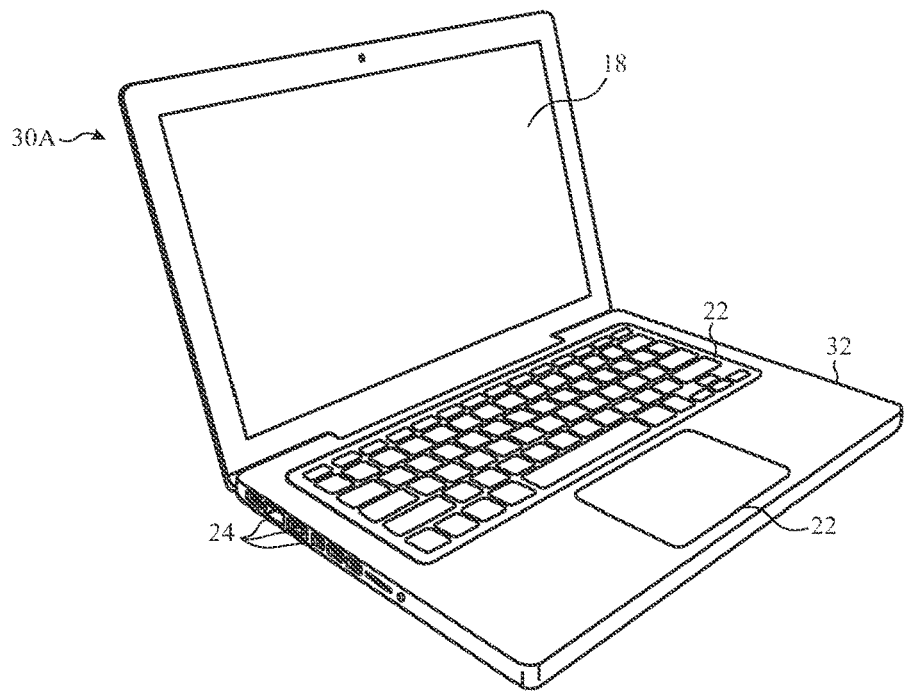
FIG. 2 is a perspective view of a notebook computer representing an embodiment of the electronic device of FIG. 1, in accordance with an embodiment.
Figure 3:
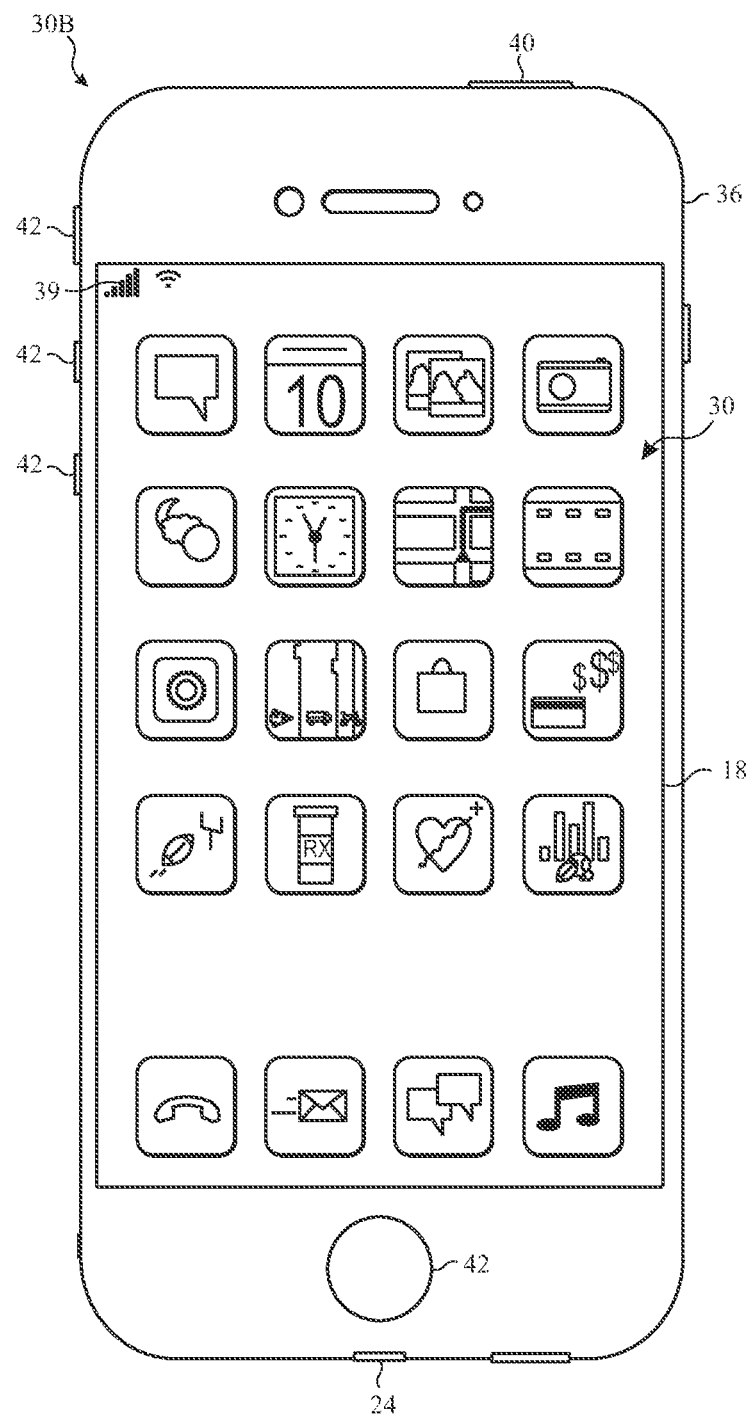
FIG. 3 is a front view of a hand-held device representing another embodiment of the electronic device of FIG. 1, in accordance with an embodiment.
Figure 4:
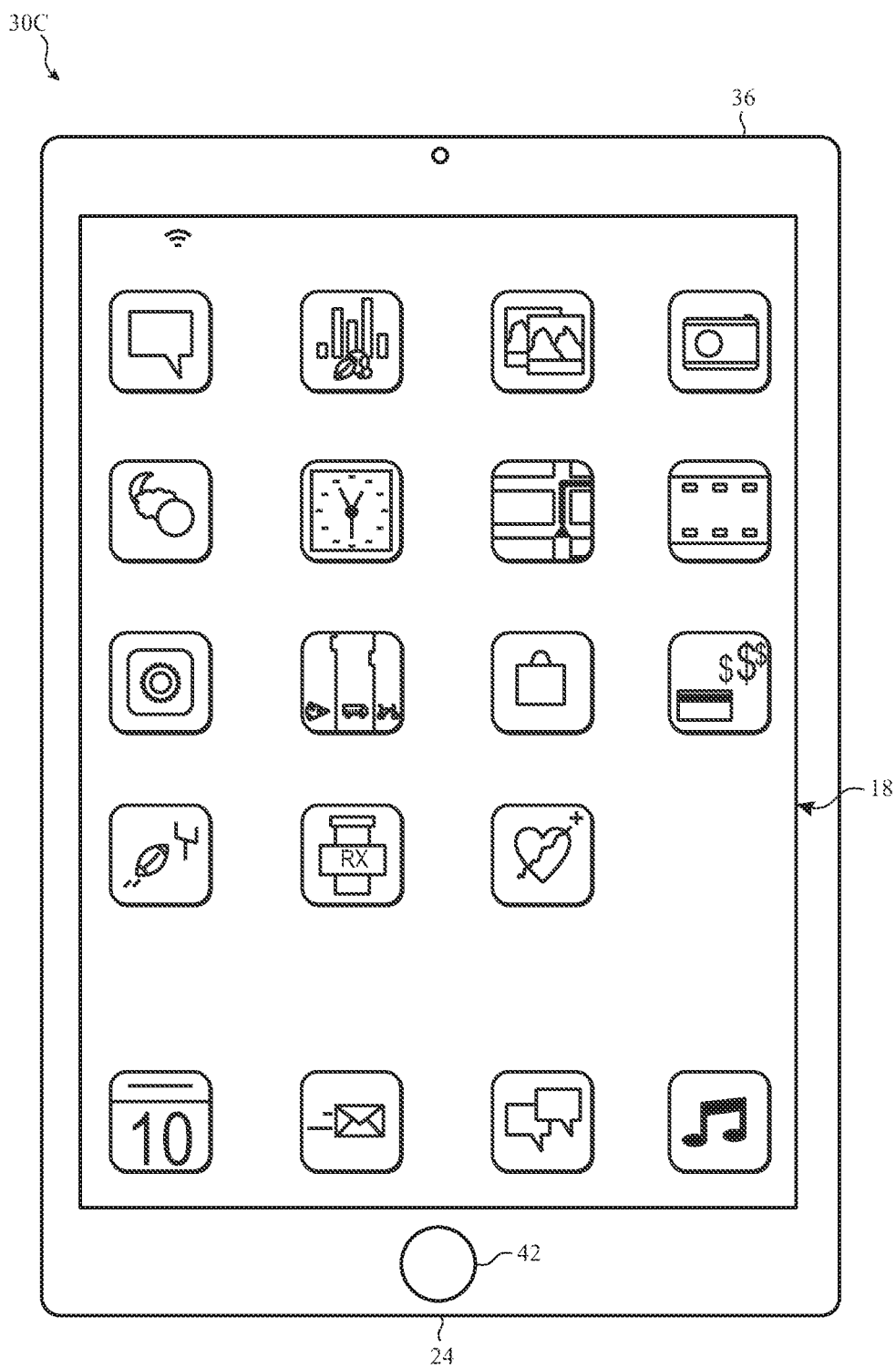
FIG. 4 is a front view of another hand-held device representing another embodiment of the electronic device of FIG. 1, in accordance with an embodiment.
Figure 5:
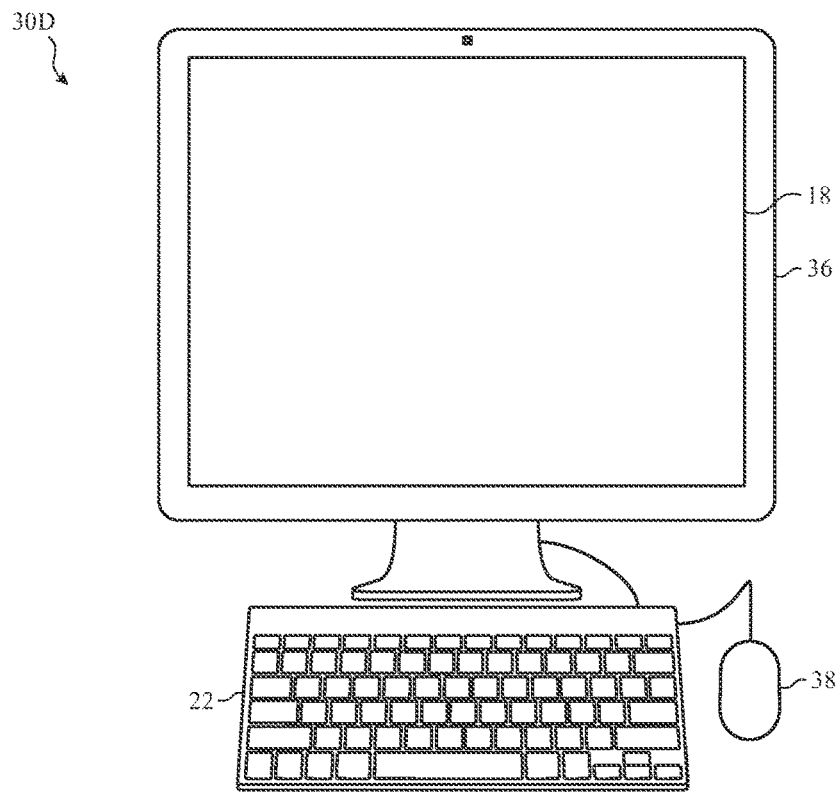
FIG. 5 is a front view of a desktop computer representing another embodiment of the electronic device of FIG. 1, in accordance with an embodiment.

By way of example, the electronic device 10 may represent a block diagram of the notebook computer 30A depicted in FIG. 2, the handheld device 30B depicted in FIG. 3, the desktop computer 30C depicted in FIG. 4, the wearable electronic device 30D depicted in FIG. 5, or similar devices. It should be noted that the processor core complex 12 and/or other data processing circuitry may be generally referred to herein as "data processing circuitry." Such data processing circuitry may be embodied wholly or in part as software, firmware, hardware, or any combination thereof. Furthermore, the data processing circuitry may be a single contained processing module or may be incorporated wholly or partially within any of the other elements within the electronic device 10.

In the electronic device 10 of FIG. 1, the processor core complex 12 and/or other data processing circuitry may be operably coupled with the memory 14 and the nonvolatile storage 16 to perform various algorithms. Such programs or instructions executed by the processor core complex 12 may be stored in any suitable article of manufacture that may include one or more tangible non-transitory computer-readable media at least collectively storing the instructions or routines, such as the memory 14 and the nonvolatile storage 16. The memory 14 and the nonvolatile storage 16 may include any suitable articles of manufacture for storing data and executable instructions, such as random-access memory, read-only memory, rewritable flash memory, hard drives, and optical discs. Also, programs (e.g., an operating system) encoded on such a computer program product may also include instructions that may be executed by the processor core complex 12 to enable the electronic device 10 to provide various functionalities.

As will be discussed further below, the display 18 may include pixels such as organic light emitting diodes (OLEDs), micro-light-emitting-diodes (μ-LEDs), or any other light emitting diodes (LEDs). Further, the display 18 is not limited to a particular pixel type, as the circuitry and methods disclosed herein may apply to any pixel type.

Accordingly, while particular pixel structures may be illustrated in the present disclosure, the present disclosure may relate to a broad range of lighting components and/or pixel circuits within display devices.

As discussed in more detail below, compensation circuitry may alter display data that is fed to the display 18, prior to the display data reaching this display 18 (or a pixel portion of the display 18). This alteration of the display data may effectively compensate for non-uniformities of the pixels of the display 18. For example, non-uniformity that may be corrected using the current techniques may include: neighboring pixels that have similar data, but different luminance, color non-uniformity between neighboring pixels, pixel row inconsistencies, pixel column inconsistencies, etc.

The input structures 22 of the electronic device 10 may enable a user to interact with the electronic device 10 (e.g., pressing a button to increase or decrease a volume level). The I/O interface 24 may enable electronic device 10 to interface with various other electronic devices, as may the network interfaces 26. The network interfaces 26 may include, for example, interfaces for a personal area network (PAN), such as a Bluetooth network, for a local area network (LAN) or wireless local area network (WLAN), such as an 802.11x Wi-Fi network, and/or for a wide area network (WAN), such as a $3^{rd}$ generation (3G) cellular network, $4^{th}$ generation (4G) cellular network, or long term evolution (LTE) cellular network. The network interface 26 may also include interfaces for, for example, broadband fixed wireless access networks (WiMAX), mobile broadband Wireless networks (mobile WiMAX), asynchronous digital subscriber lines (e.g., 15SL, VDSL), digital video broadcasting-terrestrial (DVB-T) and its extension DVB Handheld (DVB-H), ultra Wideband (UWB), alternating current (14) power lines, and so forth.

In certain embodiments, the electronic device 10 may take the form of a computer, a portable electronic device, a wearable electronic device, or other type of electronic device. Such computers may include computers that are generally portable (such as laptop, notebook, and tablet computers) as well as computers that are generally used in one place (such as conventional desktop computers, workstations and/or servers). In certain embodiments, the electronic device 10, in the form of a computer, may be a model of a MacBook®, MacBook® Pro, MacBook Air®, iMac®, Mac® mini, or Mac Pro® available from Apple Inc. By way of example, the electronic device 10, taking the form of a notebook computer 30A, is illustrated in FIG. 2 in accordance with one embodiment of the present disclosure. The depicted computer 30A may include a housing or enclosure 32, a display 18, input structures 22, and ports of an I/O interface 24. In one embodiment, the input structures 22 (such as a keyboard and/or touchpad) may be used to interact with the computer 30A, such as to start, control, or operate a GUI or applications running on computer 30A. For example, a keyboard and/or touchpad may allow a user to navigate a user interface or application interface displayed on display 18.

FIG. 3 depicts a front view of a handheld device 30B, which represents one embodiment of the electronic device 10. The handheld device 34 may represent, for example, a portable phone, a media player, a personal data organizer, a handheld game platform, or any combination of such devices. By way of example, the handheld device 34 may be a model of an iPod® or iPhone® available from Apple Inc. of Cupertino, Calif.

The handheld device 30B may include an enclosure 36 to protect interior components from physical damage and to shield them from electromagnetic interference. The enclosure 36 may surround the display 18, which may display indicator icons 39. The indicator icons 39 may indicate, among other things, a cellular signal strength, Bluetooth connection, and/or battery life. The I/O interfaces 24 may open through the enclosure 36 and may include, for example, an I/O port for a hard wired connection for charging and/or content manipulation using a standard connector and protocol, such as the Lightning connector provided by Apple Inc., a universal service bus (USB), or other similar connector and protocol.

User input structures 42, in combination with the display 18, may allow a user to control the handheld device 30B. For example, the input structure 40 may activate or deactivate the handheld device 30B, the input structure 42 may navigate user interface to a home screen, a user-configurable application screen, and/or activate a voice-recognition feature of the handheld device 30B, the input structures 42 may provide volume control, or may toggle between vibrate and ring modes. The input structures 42 may also include a microphone may obtain a user's voice for various voice-related features, and a speaker may enable audio playback and/or certain phone capabilities. The input structures 42 may also include a headphone input may provide a connection to external speakers and/or headphones.

FIG. 4 depicts a front view of another handheld device 30C which represents another embodiment of the electronic device 10. The handheld device 30C may represent, for example, a tablet computer, or one of various portable computing devices. By way of example, the handheld device 30C may be a tablet-sized embodiment of the electronic device 10, which may be, for example, a model of an iPad® available from Apple Inc. of Cupertino, Calif.

Turning to FIG. 5, a computer 30D may represent another embodiment of the electronic device 10 of FIG. 1. The computer 30D may be any computer, such as a desktop computer, a server, or a notebook computer, but may also be a standalone media player or video gaming machine. By way of example, the computer 30D may be an iMac®, a MacBook®, or other similar device by Apple Inc. It should be noted that the computer 30D may also represent a personal computer (PC) by another manufacturer. A similar enclosure 36 may be provided to protect and enclose internal components of the computer 30D such as the display 18. In certain embodiments, a user of the computer 30D may interact with the computer 30D using various peripheral input devices, such as the input structures 22 or mouse 38, which may connect to the computer 30D via a wired and/or wireless I/O interface 24.

Figure 6:
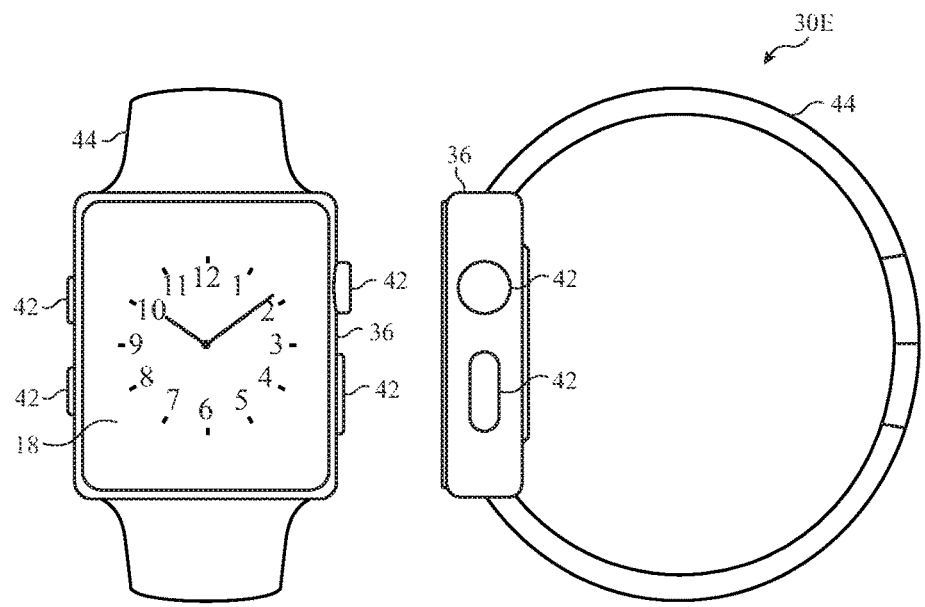
FIG. 6 is a front view of a wearable electronic device representing another embodiment of the electronic device of FIG. 1, in accordance with an embodiment.

Similarly, FIG. 6 depicts a wearable electronic device 30E representing another embodiment of the electronic device 10 of FIG. 1 that may be configured to operate using the techniques described herein. By way of example, the wearable electronic device 30E, which may include a wristband 44, may be an Apple Watch® by Apple, Inc. However, in other embodiments, the wearable electronic device 30E may include any wearable electronic device such as, for example, a wearable exercise monitoring device (e.g., pedometer, accelerometer, heart rate monitor), or other device by another manufacturer. The display 18 of the wearable electronic device 30E may include a touch screen, which may allow users to interact with a user interface of the wearable electronic device 30E.

Figure 7:
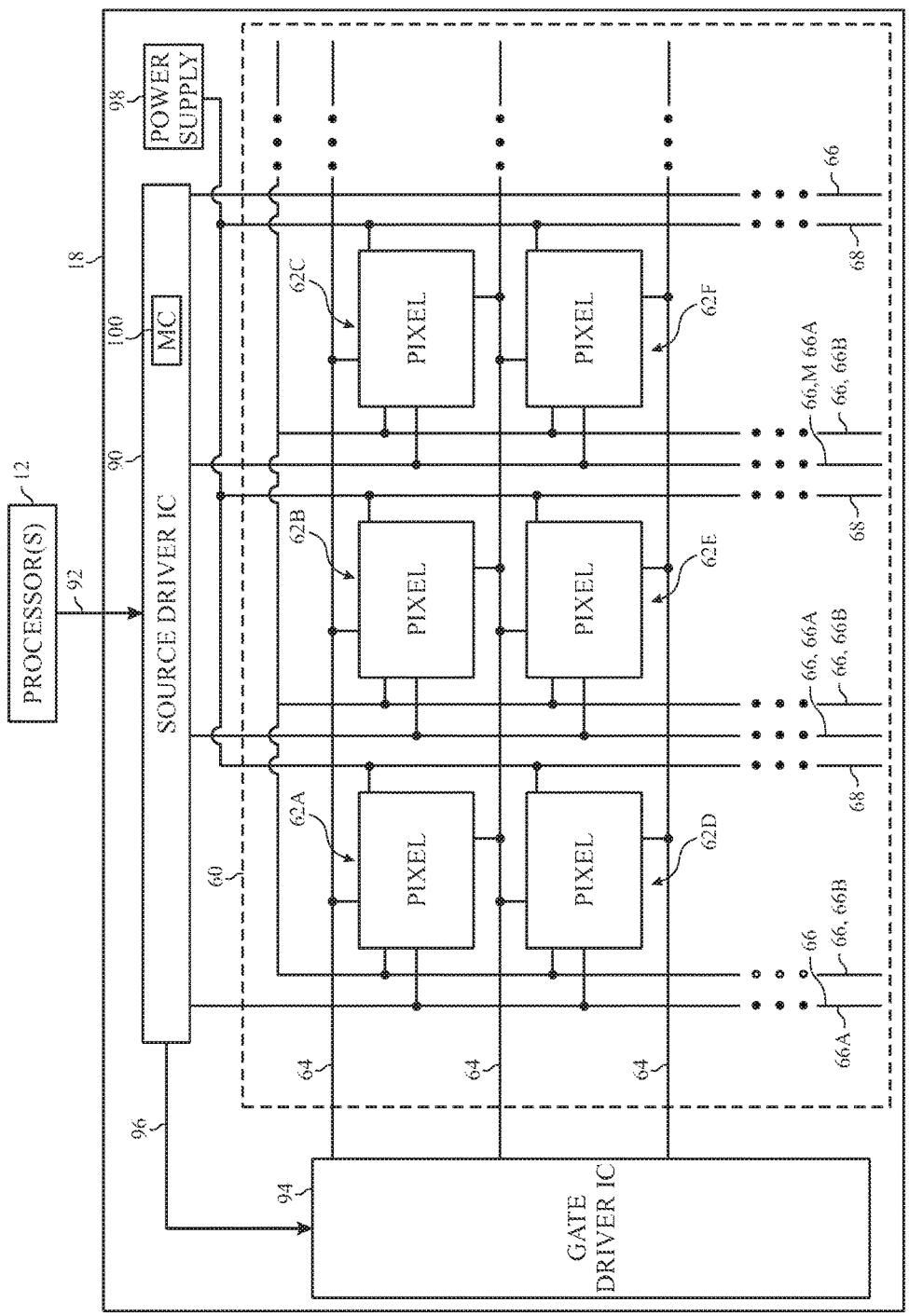
FIG. 7 is a circuit diagram illustrating a portion of an array of pixels of the display of FIG. 1, in accordance with an embodiment.

The display 18 for the electronic device 10 may include a matrix of pixels that contain light emitting circuitry. Accordingly, FIG. 7 illustrates a circuit diagram including a portion of a matrix of pixels of the display 18. As illustrated, the display 18 may include a display panel 60. Moreover, the display panel 60 may include multiple unit pixels 62 (here, six unit pixels 62A, 62B, 62C, 62D, 62E, and 62F are shown) arranged as an array or matrix defining multiple rows and columns of the unit pixels 62 that collectively form a viewable region of the display 18, in which an image may be displayed. In such an array, each unit pixel 62 may be defined by the intersection of rows and columns, represented here by the illustrated gate lines 64 (also referred to as "scanning lines") and data lines 66 (also referred to as "source lines"), respectively. Additionally, power supply lines 68 may provide power to each of the unit pixels 62. The unit pixels 62 may include, for example, a thin film transistor (TFT) coupled to a LED, whereby the TFT may be a driving TFT that facilitates control of the luminance of a display pixel 62 by controlling a magnitude of supply current flowing into the LED (e.g., an OLED) of the display pixel 62 or a TFT that controls luminance of a display pixel by controlling the operation of a liquid crystal.

Although only six unit pixels 62, referred to individually by reference numbers 62a-62f, respectively, are shown, it should be understood that in an actual implementation, each data line 66 and gate line 64 may include hundreds or even thousands of such unit pixels 62. By way of example, in a color display panel 60 having a display resolution of 1024× 768, each data line 66, which may define a column of the pixel array, may include 768 unit pixels, while each gate line 64, which may define a row of the pixel array, may include 1024 groups of unit pixels with each group including a red, blue, and green pixel, thus totaling 3072 unit pixels per gate line 64. By way of further example, the panel 60 may have a resolution of 480×320 or 960×640. In the presently illustrated example, the unit pixels 62 may represent a group of pixels having a red pixel (62A), a blue pixel (62B), and a green pixel (62C). The group of unit pixels 62D, 62E, and 62F may be arranged in a similar manner. Additionally, in the industry, it is also common for the term "pixel" may refer to a group of adjacent different-colored pixels (e.g., a red pixel, blue pixel, and green pixel), with each of the individual colored pixels in the group being referred to as a "sub-pixel."

The display 18 also includes a source driver integrated circuit (IC) 90, which may include a chip, such as a processor or application specific integrated circuit (ASIC), that controls various aspects (e.g., operation) of the display 18 and/or the panel 60. For example, the source driver IC 90 may receive image data 92 from the processor core complex 12 and send corresponding image signals to the unit pixels 62 of the panel 60. The source driver IC 90 may also be coupled to a gate driver IC 94, which may provide/remove gate activation signals to activate/deactivate rows of unit pixels 62 via the gate lines 64. Additionally, the source driver IC 90 may include a timing controller (TCON) that determines and sends timing information/image signals 96 to the gate driver IC 94 to facilitate activation and deactivation of individual rows of unit pixels 62. In other embodiments, timing information may be provided to the gate driver IC 94 in some other manner (e.g., using a controller that is separate from the source driver IC 90). Further, while FIG. 7 depicts only a single source driver IC 90, it should be appreciated that other embodiments may utilize multiple source driver ICs 90 to provide timing information/image signals 96 to the unit pixels 62. For example, additional embodiments may include multiple source driver ICs 90 disposed along one or more edges of the panel 60, with each source driver IC 90 being configured to control a subset of the data lines 66 and/or gate lines 64.

In operation, the source driver IC 90 receives image data 92 from the processor core complex 12 or a discrete display controller and, based on the received data, outputs signals to control operation (e.g., light emission) of the unit pixels 62. When the unit pixels 62 are controlled by the source driver IC 90, circuitry within the unit pixels 62 may complete a circuit between a power source 98 and light emitting elements of the unit pixels 62. Additionally, to measure operating parameters of the display 18, measurement circuitry 100 may be positioned within the source driver IC 90 to read various voltage and current characteristics of the display 18, as discussed in more detail below.

The measurements from the measurement circuitry 100 (or other information) may be used to determine offset data for individual pixels (e.g., 62A-F). The offset data may represent non-uniformity between the pixels, such as: neighboring pixels that have similar data, but different luminance, color non-uniformity between neighboring pixels, pixel row inconsistencies, pixel column inconsistencies, etc. Further, the offset data may be applied to the data controlling the pixels (e.g., 62A-F), resulting in compensated pixel data that may effectively remove these inconsistencies. In some embodiments, the external compensation circuitry may include one or more of the source driver IC 90 and the measurement circuitry 100 or may be coupled to one or more of the source driver IC 90 and the measurement circuitry 100.

Figure 8:
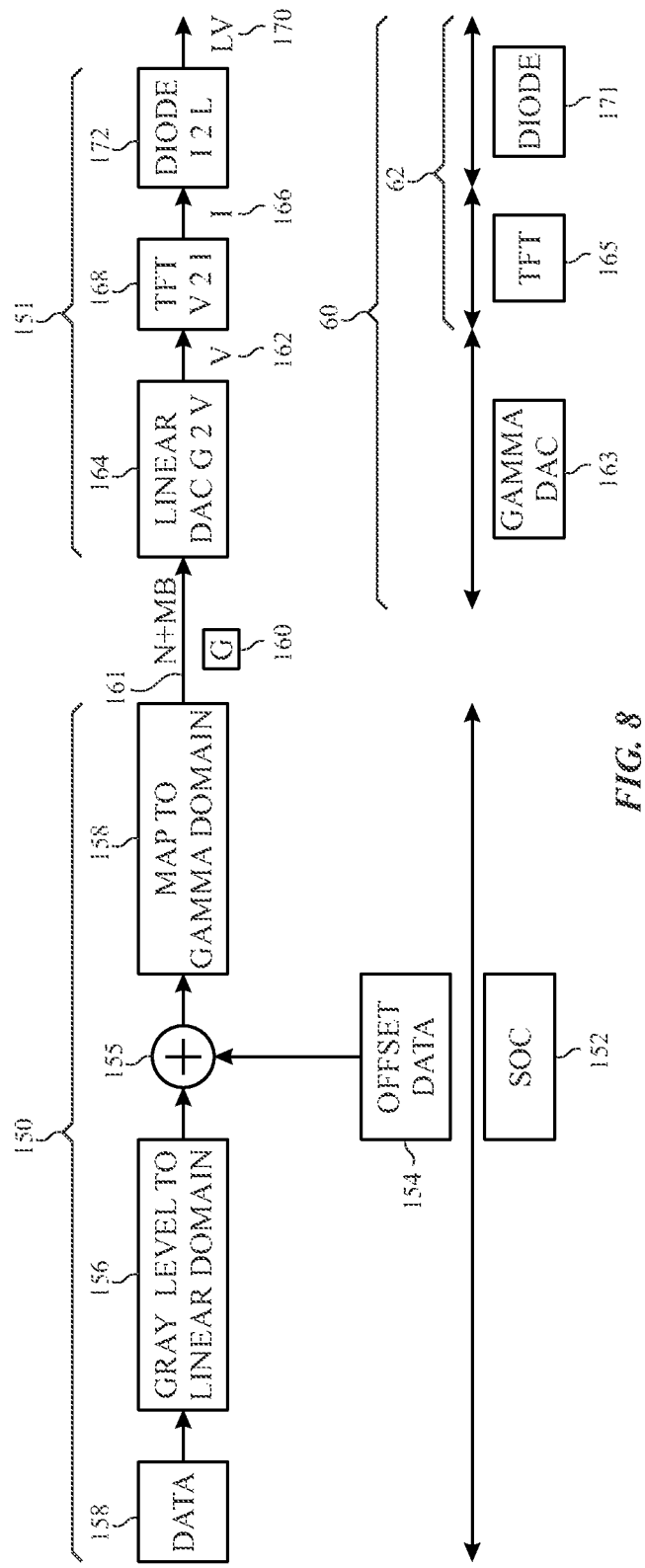
FIG. 8 is a schematic diagram illustrating processing of image data for transmission to a pixel of the array of pixels of FIG. 7, in accordance with an embodiment.

With the foregoing in mind, FIG. 8 illustrates a block diagram of a process 150 for external compensation of pixels 62 and subsequent processing 151 at the display 18, in accordance with an embodiment. Circuitry such as a system on chip (SOC) 152 may be used for pre-processing of pixel data, prior to the data reaching the display panel 60. In some embodiments, the SOC 152 may be present as external compensation circuitry. The pixel data in the SOC 152 is in the digital processing domain. On the SOC 152 side, offset data 154, representing the non-uniformity or mismatch between the pixels 62, is added 155 to the gray level data 156 (e.g., voltage values) of the pixels, which are determined using N byte input data 158. This addition of offset data 154 to the gray level data 156, results in N+M byte offset gray level data for each pixel. The offset gray level data is mapped to the gamma domain, as illustrated in block 159. This process 150 is implemented for each pixel 62 of the display panel 60. The mapped offset gray level data 160 for each pixel 62 (e.g., the externally compensated data for each pixel 62) is then provided 161 to the display panel 60.

The display panel 60 may then perform the display panel 60 processing 151. First, the display panel 60 may perform a linear digital-to-analog conversion, converting the data 160 from gray level data (G) to voltage (v) 162 (e.g., via a digital to analog converter (DAC) 163, which may be a linear DAC and or a linear gamma DAC), as illustrated by block 164. The voltage 162 may be applied to the driving TFT 165 via, for example, a source driver, resulting in a current (I) 166, as illustrated by block 168. The current 166 is then applied to a diode of the pixel 62, resulting in outputted light or luminance (Lv) 170 at a diode 171 (e.g., an OLED) of the pixel 62 or is applied to vary an operational characteristic of a liquid crystal of the pixel 62, as illustrated by block 172.

Although not depicted, the DAC 163 may be electrically coupled to a source driver (e.g., an operational amplifier), such that one source driver is present for each column of the pixel array. The source driver may amplify the received voltage signal to provide sufficient current to drive the pixel 62. Accordingly, the source driver, in conjunction with the DAC 163, may be used to drive, for example, the data lines 66, and, by extension, the TFTs 165 (e.g., activated via gate lines 68) to control luminance of, for example, an OLED coupled to the TFT 165 in the pixel 62.

In certain embodiments, the DAC 163 may be any device used to generate one or more correction voltages used to compensate for nonlinear transmittance-voltage (e.g., luminance-voltage) characteristics of, for example, an LED that may be included, for example, in the display 18. For instance, in some embodiments, the DAC 163 may include a resistive DAC (R-DAC and/or R-2R DAC) (e.g., a resistor string DAC) or other similar DAC architecture that may be used to generate a voltage value (e.g., a correction code) that may be supplied to the source driver.

Specifically, in certain embodiments, the DAC 163 may be used to convert digital levels (e.g., gray level data 160) of the image data received from the SOC 152 into analog voltage data in accordance with, for example, a target gamma curve to produce a corrected voltage that may be transmitted from the source driver as voltage 162. In this manner, the output (e.g., voltage 162) of the source driver may be used to drive the data line 66, and, by extension, the respective TFTs 70 to provide corrected image data to the respective pixel electrodes 62 of the display 18. In some embodiments, a specific (e.g., local) DAC 163 and source driver may be provided for each data line 66 to drive the individual pixels 62.

Figure 9:
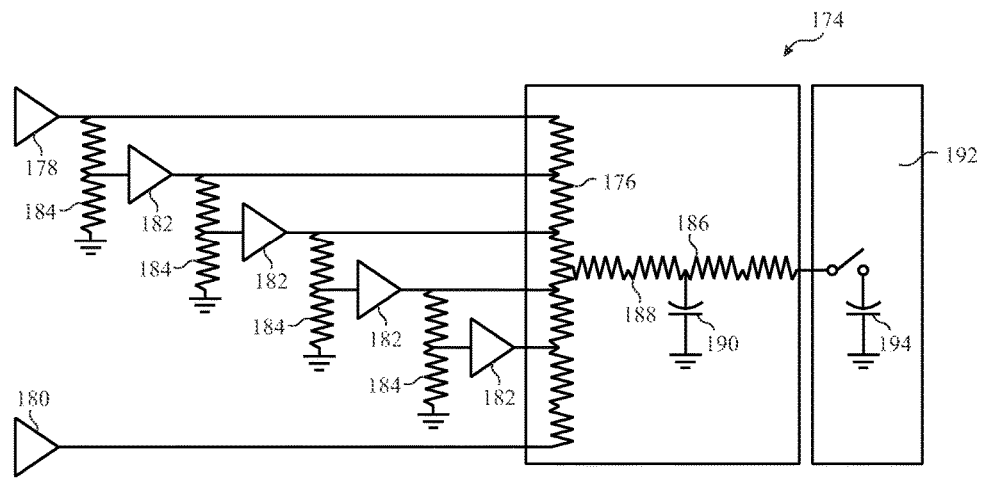
FIG. 9 is a schematic diagram illustrating a first embodiment of the analog to digital converter of FIG. 8, in accordance with an embodiment.

Thus, as illustrated in FIG. 8, the SOC 152 operates to remap nonlinear image data to a linear DAC (e.g., DAC 163) to implement external compensation. The DAC 163 should be highly linear so that the voltages outputted therefrom match the expected value transmitted from the SOC 152. FIG. 9 illustrates one embodiment of the DAC 163 that may be utilized.

FIG. 9 illustrates a cascaded DAC 174 as the DAC 163. The DAC 174 may include a resistor string 176 that may operate as a resistor ladder, which may include a number of resistors connected in series. The resistor string 176 may be coupled between a top amplifier 178 and a bottom amplifier 180. In certain embodiments, the top amplifier 178 may be coupled to the upper tap or upper rail of the resistor string 176 and may provide a reference voltage (e.g., $V_{DD}$) for the resistor string 176. Likewise, the bottom amplifier 180 may be coupled to the resistor string 176 to provide a lower reference voltage signal to, for example, the lower tap or lower rail of the resistor string 176.

Additionally, tap amplifiers 182 may be positioned along the resistor string 176, whereby the number of tap amplifiers 182 utilized depends on the bit depth of the image data. For example, for 8-bit data, 256 taps (corresponding to top amplifier 178 and 255 tap amplifiers 182) may be disposed along the resistor string 176 while for 12-bit data, 4096 taps (corresponding to top amplifier 178 and 4093 tap amplifiers 182) may be disposed along the resistor string. The tap amplifiers 182 each may operate to provide a particular voltage by breaking up the resistor string 176 such that a 6-bit DAC 174 having 64 taps (corresponding to top amplifier 178 and 63 tap amplifiers 182) may produce voltages $V_0$ to $V_{63}$. Likewise, for an 8-bit DAC 174 having 256 taps (corresponding to top amplifier 178 and 255 tap amplifiers 182), voltages $V_0$ to $V_{255}$ may be produced. In this manner, the resistor string 176 may provide a number of taps that correspond to the bit depth of the image, whereby each tap corresponds to a particular voltage that is selected based on the image data.

The output of the resistor string 176 (e.g., a selected tap providing a particular voltage) may be transmitted along bus 186 (modeled as having a bus resistance 188 and a bus load capacitance 190) to a source driver loading 192 (modeled as a switching regulator 194 with a switch that is toggled to maintain a constant output voltage). Additionally, as illustrated, the tap amplifiers 182 of the cascaded DAC 174 each have an input that is coupled to an output of a previous amplifier. Furthermore, each of the tap amplifiers 182 has a resistive load 184 to ground associated therewith. These resistive loads 184 may result in an increase in the static power consumption of the cascaded DAC 174.

Likewise, due at least to the resistive loads 184, increasing number of tap amplifiers 182 (e.g., to increase bit depth) may lead to exponential power costs (e.g., consumption). Additionally, based on the cascaded interconnection of the tap amplifiers 182, settling behavior of the cascaded DAC 174 has a ripple effect that increases the setting time (e.g., the time to settle to a target voltage at a tap) for the cascaded DAC 174. Accordingly, wakeup and shut down times for the cascaded DAC 174 may hinder and/or preclude dynamic changes to the cascaded DAC 174 due to the ripple effect and the cost in time imposed. Finally, due to the configuration of the cascaded DAC 174, the tap amplifiers 182 may be low gain amplifiers, which may increase the effect environmental conditions (e.g., temperature), process variations in production of the tap amplifiers 182, and/or the like has on offset drift of the tap amplifiers 182 (e.g., the voltage output from the tap associated with a respective tap amplifier 182).

These aforementioned potential limitations of the cascaded DAC 174 may present problems for inclusion of the cascaded DAC 174 with displays 18 that implement high refresh rates and/or utilize high bit depth image data. For example, the ripple effect for the cascaded DAC 174 may impose settling time for the cascaded DAC 174 that limits refresh rates achievable by a display 18. Likewise, increase in power that accompanies increasing numbers of tap amplifiers 182 having cascaded interconnections therebetween (to correspond to increased bit depth of the display 18) may render the cascaded DAC 174 undesirable for use in an electronic device 10. Accordingly, alternative embodiments of the DAC 163 may be beneficial.

Figure 10:
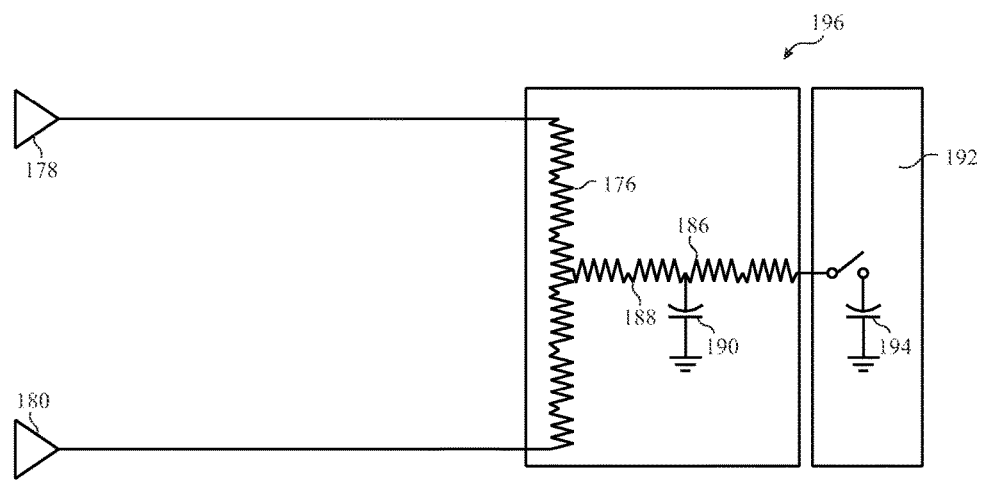
FIG. 10 is a schematic diagram illustrating a second embodiment of the analog to digital converter of FIG. 8, in accordance with an embodiment.

FIG. 10 illustrates an embodiment of a DAC 196, which may be used as the DAC 163 described above. As illustrated, the DAC 196 is implemented without any tap amplifiers 182 and instead utilizes only a top amplifier 178 and a bottom amplifier 180. The setting behavior for the DAC 196 may be dependent on a code supplied to the DAC 196, for example, the mapped offset gray level data 160 from the SOC 152. This code may operate to indicate which tap to use to pull a respective voltage output (e.g., which of the voltages $V_0$ to $V_{255}$ to be produced and transmitted along bus 186 if the DAC 196 is an 8-bit DAC). In this manner, bit depth of the display 18 is not tied to the number of amplifiers utilized in the DAC 196 (e.g., the number of amplifiers in the DAC 196 does not correspond to the number of taps and, thus, does not correspond to the bit depth of the display 18).

In some embodiments, the voltages to be supplied by the top amplifier 178 and/or the bottom amplifier 180 may set, for example, based at least in part on instructions received from a timing controller (TCON) of the display 18. The TCON may also be useful in providing localized synchronized codes to the DAC 196 that are based upon the mapped offset gray level data 160. To facilitate processing, the TCON may, in some embodiments, include an internal processor and internal memory to generate the code. Additionally, in some embodiments, the TCON may analyze received image data, for example, to determine the magnitude of voltage to apply to each pixel to display an image frame and/or the desired (e.g., target) refresh rate of the display 18 and provide control signal accordingly.

Because the voltages of the top amplifier 178 and/or the bottom amplifier 180 are set and are independently supplied (e.g., not cascaded), and because any settling behavior of the DAC 196 directly depends on the codes, there is no ripple effect present in the DAC 196 related to settling of tap voltages. Accordingly, wakeup and shut down time for the DAC 196 is reduced relative to the cascaded DAC 174. In this manner, speed for generation of an output voltage from the DAC 196 may be increased, thereby allowing for the DAC 196 to be used in conjunction with high frequency displays 18 (e.g., displays 18 with high refresh rates). Likewise, due to the absence of tap amplifiers 182 in the DAC 196, power consumption due to resistive loads 184 may be eliminated and the effects of offset drift may be drastically reduced (due to the reduced number of amplifiers present in the DAC 196). This may allow the DAC 196 to provide a high degree of configurability while maintaining power savings over, for example, the cascaded DAC 174.

Figure 11:
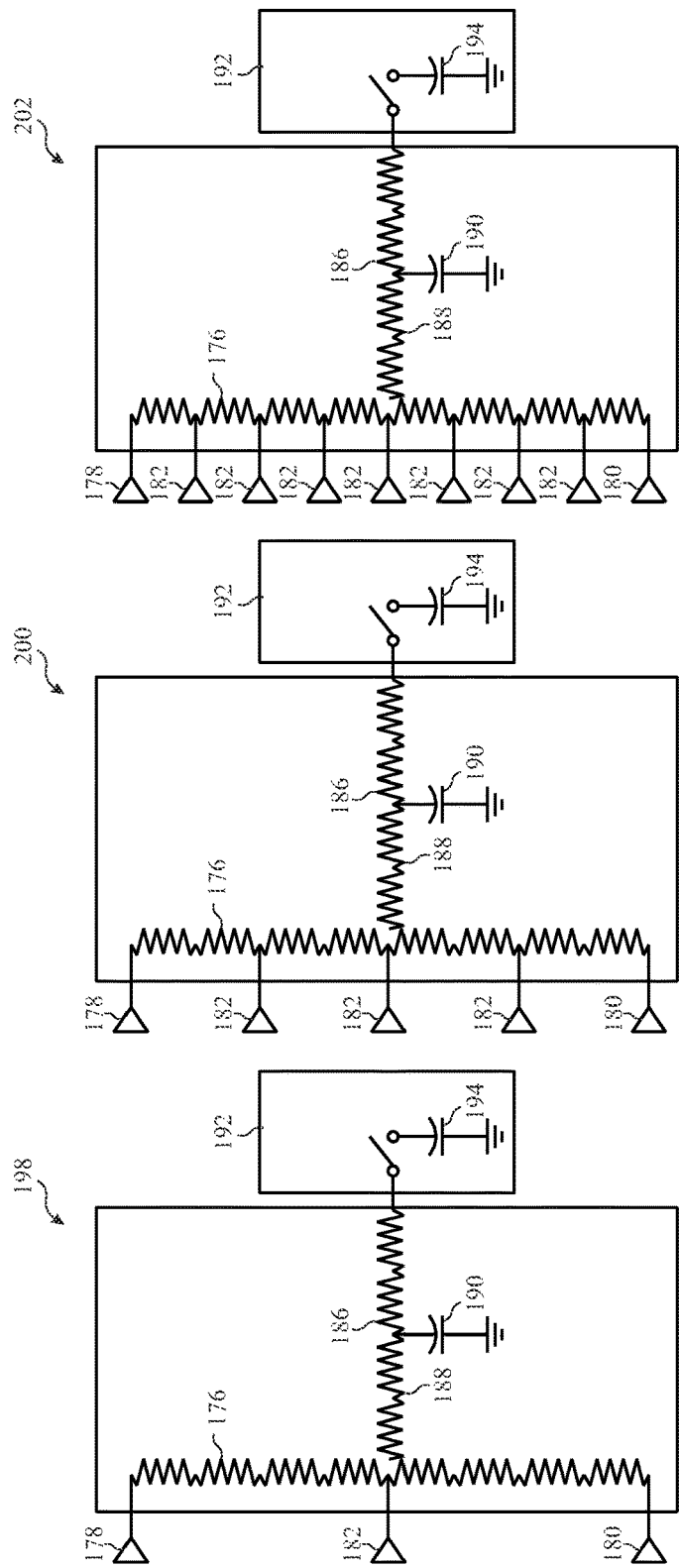
FIG. 11 is a schematic diagram illustrating a third embodiment of the analog to digital converter of FIG. 8, in accordance with an embodiment.

However, other embodiments of the DAC 163 are contemplated. For example, FIG. 11 illustrates DAC 198, DAC 200, and DAC 202, which may each be used as the DAC 163 described above. DACs 198, 200, and 202 differ from DAC 196 in that one or more tap amplifiers 182 have been added between respective top amplifier 178 and bottom amplifier 180. The addition of the one or more tap amplifiers 182 may increase for control of tap voltages (e.g., to improve settling and/or reduce deviation of a tap voltage from its target level). The one or more tap amplifiers 182 of DACs 198, 200, and 202 differ from those in DAC 174 in that they are not cascaded and they do not supply driving DC current and, thus, do not experience power consumption equivalent to the tap amplifiers 182 DAC 174. Instead, the tap amplifier 182 may merely supply a reference voltage to facilitate holding tap voltages relatively constant.

In some embodiments, the placement of the one or more amplifiers in the DACs 198, 200, and 202 may follow a pattern of 2N−1, 2N, or 2^N−1, where N is an integer so that there is no change in the fundamental step size within the respective DAC 198, 200, and 202 (e.g., so that an equal number of resistors of resistor string 176 are disposed between the tap amplifiers 182). Furthermore, the one or more tap amplifiers 182 of DACs 198, 200, and 202 may be adaptive in that they may be activated and/or deactivated (e.g., the one or more tap amplifiers 182 may be placed into a high impedance state when not activated), for example, by the TCON. This may also allow for control of the power consumed by the DACs 198, 200, and 202 (e.g., having less tap amplifiers 182 that are active reduces power consumption of the DACs 198, 200, and 202).

It may be beneficial to include the one or more tap amplifiers 182 in the DACs 198, 200, and 202 to facilitate improving linearity of the resistor string 176 (e.g., by including one or more tap amplifiers 182, target voltages at one or more taps of the resistor string can be controlled and, thus, more closely maintained in a linear relationship to the remaining taps). That is, the likely deviation from linearity across the resistor string 176 may be reduced through the use of one or more tap amplifiers 182 in the DACs 198, 200, and 202. Additionally, in some embodiments, the DACs 198, 200, and 202 may improve implementation flexibility. For example, higher bit depths may be supported merely by increasing number of resistor and/or taps in the resistor string 175 without increase number of tap amplifiers 182. It is also noted that in some embodiments, the one or more tap amplifiers 182 could be implemented in conjunction with a nonlinear DAC, such that each tap amplifier 182 is connected to each tap of the nonlinear DAC.

As illustrated in FIGS. 9-11, the output of the resistor string 176 (e.g., a selected tap providing a particular voltage) may be transmitted along bus 186 (modeled as having a bus resistance 188 and a bus load capacitance 190). The routing of the bus 186 across a device may impose significant impedance (e.g. bus resistance 188 and a bus load capacitance 190) as well as operate as a bottleneck to the settling behavior of the DAC 163, which may hamper use in high refresh rate displays. To alleviate these issues, in some embodiments, modifications to the resistor string 176 may be desirable.

Figure 12:
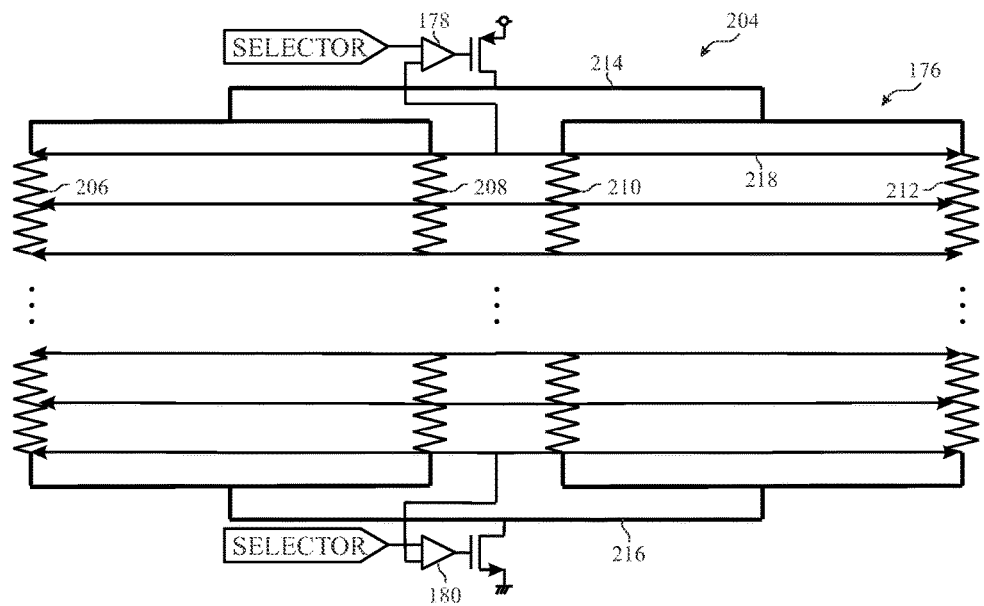
FIG. 12 is a schematic diagram illustrating a first routing layout of the resistor string of the analog to digital converter of FIG. 10, in accordance with an embodiment.

For example, FIG. 12 illustrates a DAC 204 having a resistor string 176 implemented as resistor string portions 206, 208, 210, and 212. It should be noted that the subdivision of the resistor string 176 into four resistor string portions 206, 208, 210, and 212 may be altered to include fewer or more than four portions. Each resistor string portion 206, 208, 210, and 212 may be copies of one another that each have four times the resistance for each resistor therein relative to the resistors in resistor string 176 so that the overall resistance is unchanged. Likewise, taps from resistor string 176 may be divided amongst the resistor string portions 206, 208, 210, and 212 so that the overall number of taps for DAC 204 is unchanged relative to, for example, DAC 196.

By subdividing the resistor string 176 into resistor string portions 206, 208, 210, and 212, freedom to move the resistor string portions 206, 208, 210, and 212 to different places in the display 18 is available. This may allow for placement of the resistor string portions 206, 208, 210, and 212, for example, closer to a source driver than otherwise would be possible. Furthermore, dispersal of the resistor string portions 206, 208, 210, and 212 in the manner described above may be accomplished without an impact to the active area consumed relative to use of a resistor string 176. In some embodiments, the connection buses 214 and 216 coupled to each the resistor string portions 206, 208, 210, and 212 may be relatively larger (e.g., have a lower resistance) than, for example, the connection bus 218 that may be coupled to the source driver. This reduced resistance for routing may facilitate further increasing settling of the DAC 204.

Figure 13:
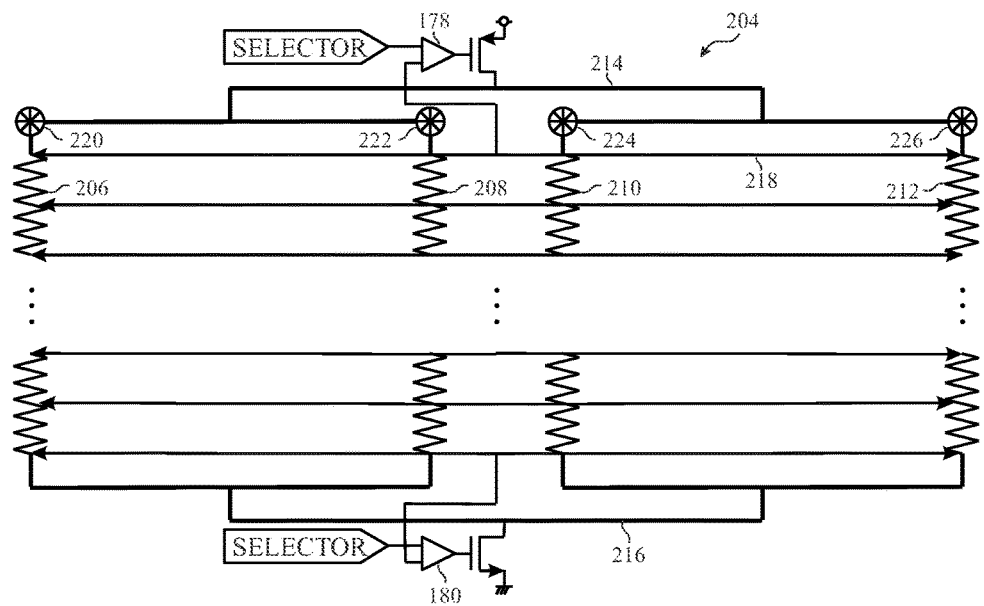
FIG. 13 is a schematic diagram illustrating a second routing layout of the resistor string of the analog to digital converter of FIG. 10, in accordance with an embodiment.

In some embodiments, as illustrated in FIG. 13, the resistor string portions 206, 208, 210, and 212 may be removable. This adjustment may be dynamically when disconnection points 220, 222, 224, and 226 are switches (controlled, for example, by the TCON) or this may be done, for example, when the DAC 204 is manufactured (e.g., by omitting connection material, using non-conductive material, or otherwise preventing connections at one or more of the disconnection points 220, 222, 224, and 226). This may provide additional flexibility and/or power savings by reducing the amount of overall resistance in the DAC 204.

It is also noted that, in some embodiments, the amplifiers (e.g., top amplifier 178, bottom amplifier 180, and tap amplifiers 182) of any of the DACs 196, 198, 200, 202, and 204 may experience offset whereby the voltage output from the one or more of the amplifiers (e.g., top amplifier 178, bottom amplifier 180, and tap amplifiers 182) differs from the expected (e.g., target) output voltage. This offset may be due to environmental factors (e.g., temperature), manufacturing deviations, and the like. Correction of this offset experienced by amplifiers (e.g., top amplifier 178, bottom amplifier 180, and tap amplifiers 182) of any of the DACs 196, 198, 200, 202, and 204 may be desirable.

Figure 14:
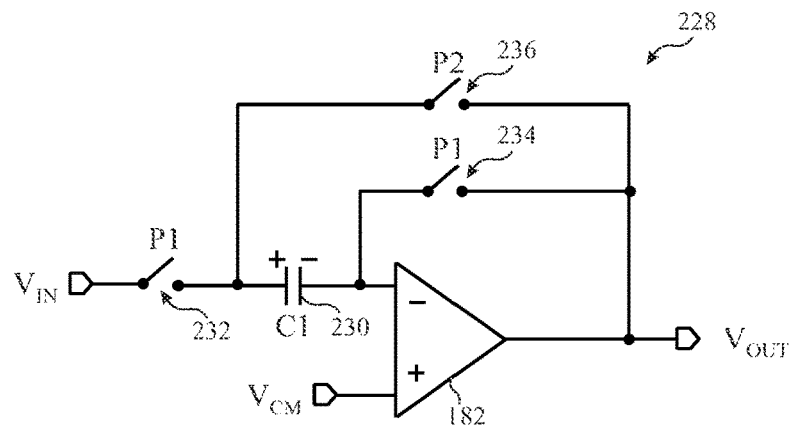
FIG. 14 illustrates a circuit diagram that compensates for an offset of an amplifier within the analog to digital converter of FIG. 12, in accordance with at least one embodiment.

FIG. 14 illustrates a circuit diagram that compensates for (e.g., reduces and/or eliminates) effects of offset of an amplifier (e.g., top amplifier 178, bottom amplifier 180, and tap amplifiers 182) of any of the DACs 196, 198, 200, 202, and 204 on their amplified voltage output as an analog auto zeroing circuit 228. As shown in FIG. 14, the tap amplifier 182 may be coupled to a capacitor (e.g., C1) 230 via an inverting terminal of the amplifier 182 (while tap amplifier 182 is illustrated, the techniques described herein may also be applied to top amplifier and/or bottom amplifier 180). The capacitor C1 230 may also be coupled to an input voltage (Vin) via a switch 232 while the tap amplifier 182 is also coupled to a fixed common mode voltage (Vcm).

As illustrated in FIG. 14, the capacitor C1 230 may also be coupled to the output terminal of the tap amplifier 182 via switch 234 at a node that is coupled to the inverting terminal of the tap amplifier 182. Switches 232 and 234 may operate (e.g., open and close) based on the whether the tap amplifier 182 is in a sampling phase (e.g., charging capacitor) or driving phase (e.g., providing voltage). That is, the switches 232 and 234 may both open and close at the same times, for example, according to a phase 1 (P1) signal supplied by a timing controller (TCON) in the display 18.

A third switch 236 may be coupled to a separate terminal of the capacitor C1 230 as compared to the switch 234. The switch 236 may also couple the capacitor C1 230 to the output (Vout) of the tap amplifier 182 when closed. That is, the switch 236 may both open and close, for example, according to a phase 2 (P2) signal supplied by a timing controller (TCON) in the display 18. It should be noted that the switches described herein with respect to FIGS. 14-16 may be controlled or operated via a timing controller or other suitable processor device that may be part of the display 18, the SOC 152, or the like. In addition, it should also be noted that the switches described with respect FIGS. 14-16 may be any suitable type of switching device, such as transistors, semi-conductor devices, and the like.

Figure 15:
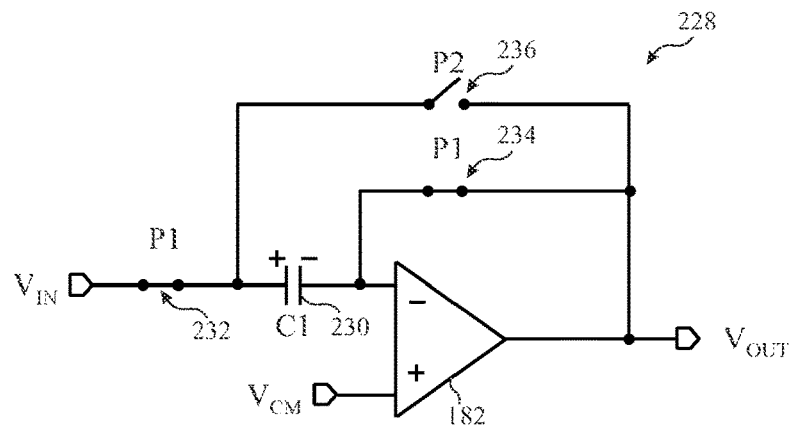
FIG. 15 illustrates a first phase of operation for operating the amplifier of FIG. 14, in accordance with at least one embodiment.

With the analog auto zeroing circuit 228 in mind, FIG. 15 illustrates a first phase of operation for operating the tap amplifier 182 of FIG. 14 in accordance with the sampling phase. That is, when sampling the analog voltage signal input to the tap amplifier 182, the switches 232 and 234 are closed and the switch 236 is opened. As such, the capacitor C1 230 is charged to a desired analog voltage value that corresponds to the voltage to be provided from the tap amplifier 182.

During this phase of operation, the output (Vout) of the tap amplifier 182 is independent of the offset of the tap amplifier 182, since the output (Vout) of the tap amplifier 182 is coupled to the capacitor C1 (230), which is coupled to the input to tap amplifier 182 and to the inverting terminal of the tap amplifier 182. The output (Vout) of the tap amplifier 182 may be characterized as follows:

$$Vout=Vcm+Voffset \quad (1)$$

In Equation 1, Vcm corresponds to the common mode voltage and Voffset corresponds to the offset voltage of the tap amplifier 182. Using the equation above regard the output voltage (Vout), the voltage (Vcap) of the capacitor C1 230 may be characterized as:

$$Vcap=Vin-Vout=Vin-(Vcm+Voffset) \quad (2)$$

Figure 16:
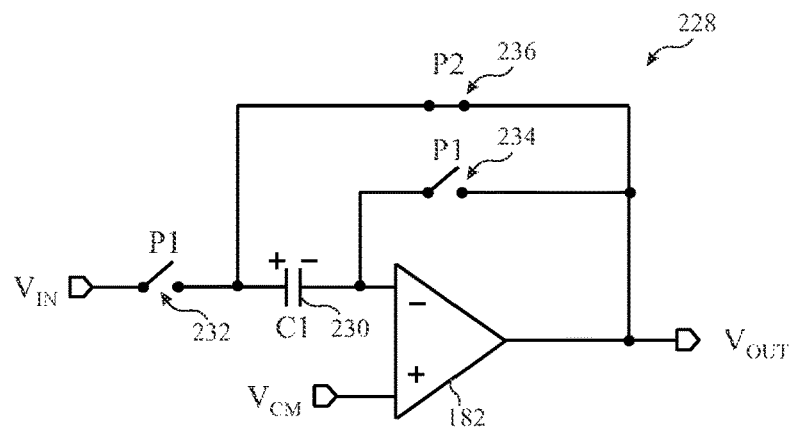
FIG. 16 illustrates a second phase of operation for operating the amplifier of FIG. 14, in accordance with at least one embodiment.

In Equation 2, Vin corresponds to the analog voltage signal input to the tap amplifier 182. After charging the capacitor C1 230 during the sampling phase, the switches 232 and 234 are opened and the switch 236 is closed during a drive (e.g., hold) phase as shown in FIG. 16. As such, the capacitor C1 230 is disconnected from Vin and the output of the tap amplifier 182 is coupled to the capacitor C1 230. As a result, the output voltage (Vout) of the tap amplifier 182 is characterized as:

$$Vout=Vcm+Voffset-(-Vcap) \quad (3)$$

Since the capacitor C1 230 has been charged during the sampling phase and the voltage (Vcap) corresponds to Equation 2, the output voltage (Vout) of the tap amplifier 182 is also characterized as:

$$Vout=Vcm+Voffset-(-(Vin-(Vcm+Voffset)))$$

$$Vout=Vcm+Voffset+Vin-Vcm-Voffset$$

$$Vout=Vin \quad (4)$$

As such, by operating in the two-phase operation scheme depicted in FIGS. 15 and 16, the output voltage (Vout) of the tap amplifier 182 removes or reduces the offset properties (e.g., Voffset) present in the output voltage (Vout) of the tap amplifier 182. In this way, the effect of the offset properties of the tap amplifier 182 on the amplified analog voltage signal (Vout) may be reduced. It should be appreciated that analog auto zeroing circuit 228 is one representation that may operate to reduce and/or eliminate amplifier offset for any of the DACs 196, 198, 200, 202, and 204. Other circuits, including other switch capacitor circuits, are envisioned as being usable in place of analog auto zeroing circuit 228, for example, to cancel charge injection resulting from opening or closing the switches.

Figure 17:
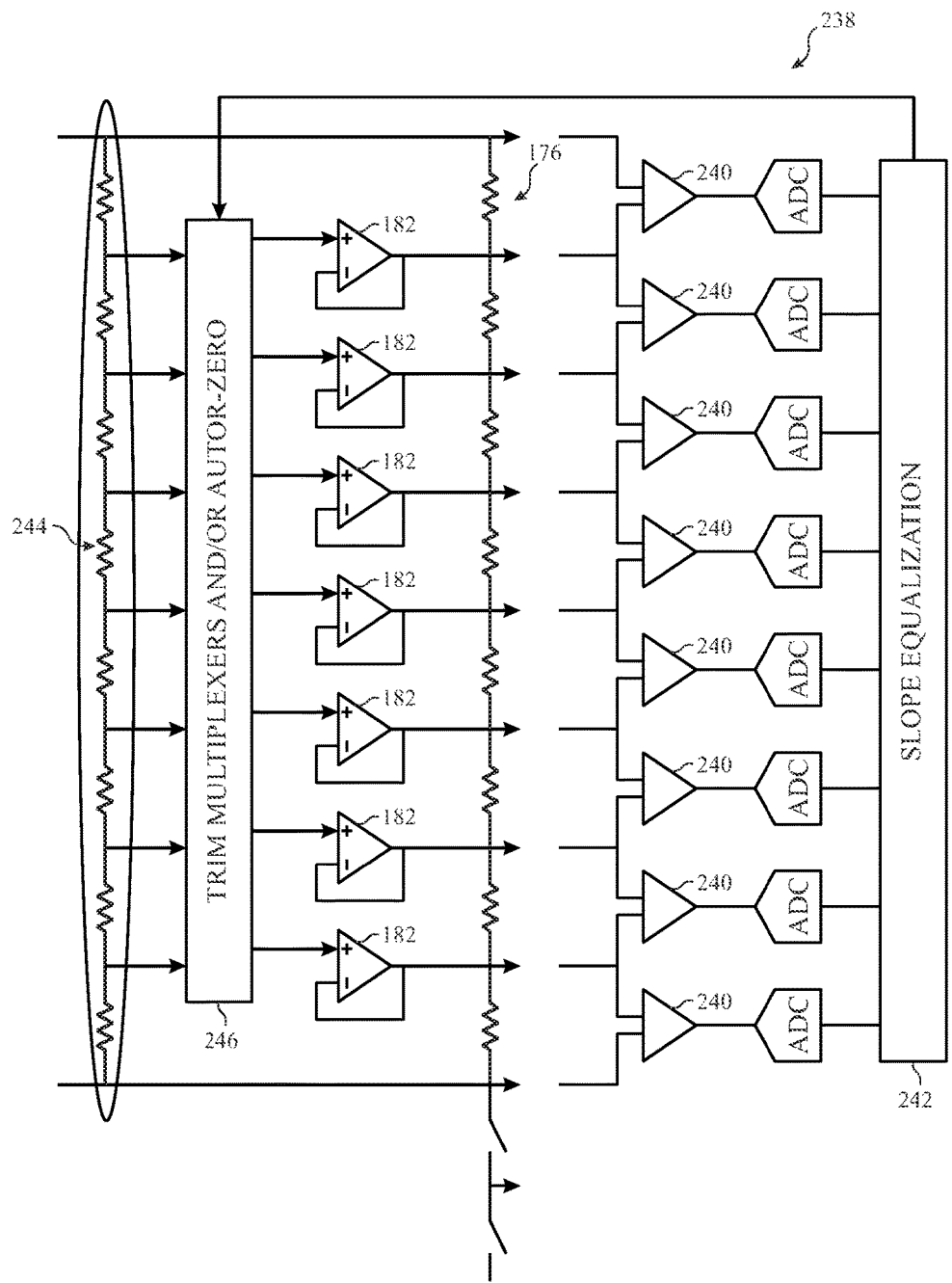
FIG. 17 is a schematic diagram of a second embodiment to compensate for an offset of an amplifier within the analog to digital converter of FIG. 12, in accordance with at least one embodiment.

Other techniques for the reduction of offset are also contemplated. For example, FIG. 17 illustrates a digital auto zeroing circuit 238. The digital auto zeroing circuit 238, as illustrated, may include tap amplifiers 182 of, for example, DAC 202. However, the digital auto zeroing circuit 238 may additionally or alternatively be utilized with any of DACs 196, 198, 200, 202, and 204. As illustrated, differences between tap amplifiers 182 may be measured through the comparison (via comparators 240) of voltages at taps corresponding to the respective tap amplifiers 182 being monitored. The measured voltage may be compared against a target (e.g., expected) voltage in the slope equalization element 242 (which may be a portion of the TCON or may be code (e.g., a program) running on a processor of the TCON). Based on the comparison, an adjustment to the input voltage (e.g., Vin selected from the tap amplifier trim string 244) may be made in response to a control signal (e.g., a trim code) transmitted to the trim multiplexers 246 that operate as auto-zero circuitry. This process may be iteratively repeated (e.g., at set periods of time such as once a second, twice a second, once a frame, or the like) until no offset for the tap amplifiers 182 remain (e.g., until the slopes between channels have been equalized).

In this manner, the slope equalization element 242 performs the equivalent by driving a second derivative (e.g., the difference between each set of taps) to zero. Additionally, as illustrated, the digital auto zeroing circuit 238 operates without reliance on capacitors for maintaining trim, so leakage issues do not disturb performance. Additionally, power overhead can be minimal, the tap amplifiers 182 may maintain a relatively simple design, and there is minimal settling imparted to the voltage adjustments when trim codes are updated. Accordingly, the digital auto zeroing circuit 238 may be useful to reduce offset in one or more of the DACs 196, 198, 200, 202, and 204.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. A device, comprising:
   a resistor string comprising a plurality of resistors with voltage taps disposed therebetween, wherein the device is configured to select one particular voltage tap of the plurality of voltage taps based on received gray level data for a pixel of a display;
   a first amplifier configured to be coupled to a first terminal end of the resistor string; and
   a second amplifier configured to be coupled to a second terminal end of the resistor string, wherein the plurality of voltage taps are configured to each supply a tap voltage derived from a voltage between the first amplifier and the second amplifier, wherein any tap amplifier of the device coupled to a voltage tap of the plurality of voltage taps provides a reference voltage thereto, and at least one of the plurality of voltage taps is not coupled to a corresponding amplifier supplying a voltage to the at least one voltage tap with the resistor string implementing a linear voltage across the resistor string.

2. The device of claim 1, comprising a tap amplifier coupled to the resistor string between the first terminal end of the resistor string and the second terminal end of the resistor string.

3. The device of claim 2, wherein the tap amplifier is coupled to the resistor string such that an equal number of the plurality of resistors are disposed between the tap amplifier and each of the first terminal end of the resistor string and the second terminal end of the resistor string.

4. The device of claim 2, comprising a second tap amplifier coupled to the resistor string between the first terminal end of the resistor string and the second terminal end of the resistor string.

5. The device of claim 4, wherein the tap amplifier and the second tap amplifier are coupled to the resistor string such that an equal number of the plurality of resistors are disposed between the tap amplifier and the first terminal end of the resistor string, between the tap amplifier and the second tap amplifier, and between the second tap amplifier and the second terminal end of the resistor string.

6. The device of claim 2, wherein an input of the tap amplifier is distinct from an output of the first amplifier.

7. The device of claim 1, wherein the device is configured to operate as a digital to analog converter.

8. The device of claim 1, wherein the one particular voltage tap of the plurality of voltage taps is configured to transmit a voltage signal along a bus to a source driver to provide image data to the pixel of the display.

9. A device, comprising:
   a digital-to-analog convertor comprising a first amplifier configured to be coupled to a first terminal end of each resistor string of a plurality of resistor strings, wherein each resistor string of the plurality of resistor strings comprises a plurality of resistors with voltage taps disposed therebetween, wherein each voltage tap of the plurality of voltage taps receives a reference voltage from any tap amplifier of the device coupled thereto in addition to a supply voltage from the first amplifier.

10. The device of claim 9, comprising a second amplifier configured to be coupled to a second terminal end of each resistor string of the plurality of resistor strings.

11. The device of claim 9, wherein each resistor string of the plurality of resistor strings is disposed in an electrically parallel configuration with all remaining resistor strings of the plurality of resistor strings.

12. The device of claim 9, comprising a first connection bus configured to couple the first amplifier with the first terminal end of each resistor string of the plurality of resistor strings.

13. The device of claim 12, comprising a second connection bus configured to be coupled to at least one resistor from each resistor string of the plurality of resistor strings.

14. The device of claim 13, wherein the first connection bus is configured to have less electrical resistance than the second connection bus.

15. The device of claim 12, comprising a disconnection point disposed at each junction of the first connection bus and the first terminal end of each resistor string of the plurality of resistor strings.

16. The device of claim 15, wherein the disconnection point comprises a switch.

17. The device of claim 15, wherein the disconnection point is configured to prevent coupling of the first connection bus with the first terminal end of each resistor string of the plurality of resistor strings.

18. A device, comprising:
   a digital-to-analog converter comprising:
     an amplifier configured to:
       generate an output voltage based on an input voltage, wherein the output voltage has been altered based on an offset affecting the amplifier to compensate for the offset, and
       transmit the output voltage to a resistor string comprising a plurality of resistors with voltage taps disposed therebetween;
     a capacitor;
     a first switch comprising:
       a first terminal coupled to a first capacitor terminal of the capacitor and an input to the amplifier; and
       a second terminal coupled to an output of the amplifier; and
     a second switch comprising:
       a third terminal coupled to a second capacitor terminal of the capacitor; and
       a fourth terminal coupled to the output of the amplifier.

19. The device of claim 18, comprising an analog auto zeroing circuit comprising a switch coupled to both an input and an output of the amplifier and a capacitor coupled to the input of the amplifier, wherein the analog auto zeroing circuit is configured to alter the output voltage to compensate for the offset.

20. The device of claim 18, comprising a digital auto zeroing circuit configured to alter the input voltage to alter the output voltage to compensate for the offset.

\* \* \* \* \*